(12) United States Patent
Lyon et al.

(10) Patent No.: US 8,797,282 B2
(45) Date of Patent: Aug. 5, 2014

(54) TOUCH SENSOR WITH SECONDARY SENSOR AND GROUND SHIELD

(75) Inventors: Benjamin B. Lyon, San Jose, CA (US); Peter W. Richards, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 719 days.

(21) Appl. No.: 12/906,921

(22) Filed: Oct. 18, 2010

(65) Prior Publication Data
US 2012/0092270 A1  Apr. 19, 2012

(51) Int. Cl.
*G06F 3/041* (2006.01)

(52) U.S. Cl.
USPC .................. 345/173; 200/600; 178/18.03

(58) Field of Classification Search
USPC .............. 345/156–184; 178/18.01–20.04; 349/12; 257/41, 414–470; 200/600, 200/406, 513–516
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,841,427 A * | 11/1998 | Teterwak | 345/173 |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,373,474 B1 * | 4/2002 | Katabami | 345/173 |
| 6,690,387 B2 | 2/2004 | Zimmerman et al. | |
| 7,015,894 B2 | 3/2006 | Morohoshi | |
| 7,075,026 B2 * | 7/2006 | Huang et al. | 200/516 |
| 7,184,064 B2 | 2/2007 | Zimmerman et al. | |
| 7,663,607 B2 | 2/2010 | Hotelling et al. | |
| 8,479,122 B2 | 7/2013 | Hotelling et al. | |
| 2006/0026521 A1 | 2/2006 | Hotelling et al. | |
| 2006/0197753 A1 | 9/2006 | Hotelling | |
| 2007/0052044 A1 * | 3/2007 | Forsblad et al. | 257/414 |
| 2008/0007533 A1 * | 1/2008 | Hotelling | 345/173 |
| 2009/0167699 A1 * | 7/2009 | Rosenblatt et al. | 345/173 |
| 2010/0097346 A1 * | 4/2010 | Sleeman | 345/174 |

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (May 1992). "Combining Gestures and Direct Manipulation," CHI '92, pp. 659-660.

* cited by examiner

*Primary Examiner* — Liliana Cerullo
(74) *Attorney, Agent, or Firm* — Morrison & Foerster LLP

(57) ABSTRACT

A touch sensor pattern with a secondary sensor formed substantially as part of the touch sensor pattern is provided. By forming the secondary sensor substantially as part of the touch sensor pattern, where the secondary sensor can be held at a steady state or ground during a touch scan cycle of the touch sensor, an overall thickness of the stackup at the area of the touch sensor where the secondary sensor is formed can be significantly reduced. The reduction in the thickness can allow more space for other hardware such as a device battery, for example. Moreover, grounding the secondary sensor can shield the touch sensor pattern at the area of the touch sensor pattern where the secondary sensor is formed, during a touch scan cycle.

23 Claims, 11 Drawing Sheets

Tracking Signal

Button Signal

TOUCH SENSOR WITH SECONDARY SENSOR AND GROUND SHIELD

FIELD OF THE DISCLOSURE

This relates generally to touch sensors, and more particularly to a touch sensor pattern with at least one secondary sensor, formed as part of the touch sensor pattern, and a ground shield.

BACKGROUND OF THE DISCLOSURE

There exist today many styles of input devices for performing operations in a consumer electronic device. These operations often generally correspond to actions such as moving a cursor and making selections on a display screen. By way of example, the input devices may include buttons, switches, keyboards, mice, trackballs, touch pads, joy sticks, touch screens and the like. Each of these devices has advantages and disadvantages that may be taken into account when designing the consumer electronic device. In handheld computing devices, the input devices are often generally selected from buttons and switches. Buttons and switches are generally mechanical in nature and provide limited control with regards to the movement of a cursor (or other selector) and making selections. For example, they are generally dedicated to moving the cursor in a specific direction (e.g., arrow keys) or to making specific selections (e.g., enter, delete, number, etc.).

In portable computing devices such as laptop computers, the input devices are commonly track pads (also known as touch pads). With a track pad, the movement of an input pointer (i.e., cursor) usually corresponds to the relative movements of the user's finger (or stylus) as the finger is moved along a surface of the track pad. Some track pads can also make a selection on the display screen when one or more taps are detected on the surface of the track pad. In some cases, any portion of the track pad may be tapped, and in other cases a dedicated portion of the track pad may be tapped. In yet another example, the track pad may include a button switch circuit coupled thereto, such that a user can press a portion of the track pad that is configured to activate the button switch in order to make selections.

In the case of hand-held personal digital assistants (PDA) or mobile devices, the input devices tend to utilize touch-sensitive display screens. When using a touch screen, a user can make a selection on the display screen by pointing directly to objects on the screen using a stylus or finger. Touch screens are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

SUMMARY OF THE DISCLOSURE

Presently disclosed embodiments are directed to solving issues relating to one or more of the problems presented in the prior art, as well as providing additional features that will become readily apparent by reference to the following detailed description when taken in conjunction with the accompanying drawings.

This relates to a touch sensor pattern with at least one secondary sensor formed substantially as part of the touch sensor pattern. By forming the secondary sensor substantially as part of the touch sensor pattern, where the secondary sensor can be held at a steady state during a touch scan cycle of the touch sensor, an overall thickness of the stackup at the area of the touch sensor where the secondary sensor is formed can be significantly reduced. Moreover, grounding the secondary sensor can shield the touch sensor pattern at the area of the touch sensor pattern where the secondary sensor is formed, during a touch scan cycle. This shielding can be performed by grounding, or virtually grounding by being held at a constant direct current (DC) voltage, the secondary senor with respect to the touch sensor pattern. Alternatively, the secondary sensor can be held at a steady state by AC coupling the secondary sensor to at least one of a DC voltage or ground.

According to one embodiment, when the secondary sensor is held at a steady state, touch sensor pattern can perform a touch scan cycle even at a portion of the touch sensor pattern where the secondary pattern is formed. Accordingly, the touch sensor pattern can provide touch sensitivity over the entire surface area of a touch sensor device, including the portion where the secondary sensor is formed.

DETAILED DESCRIPTION

Figure 1:
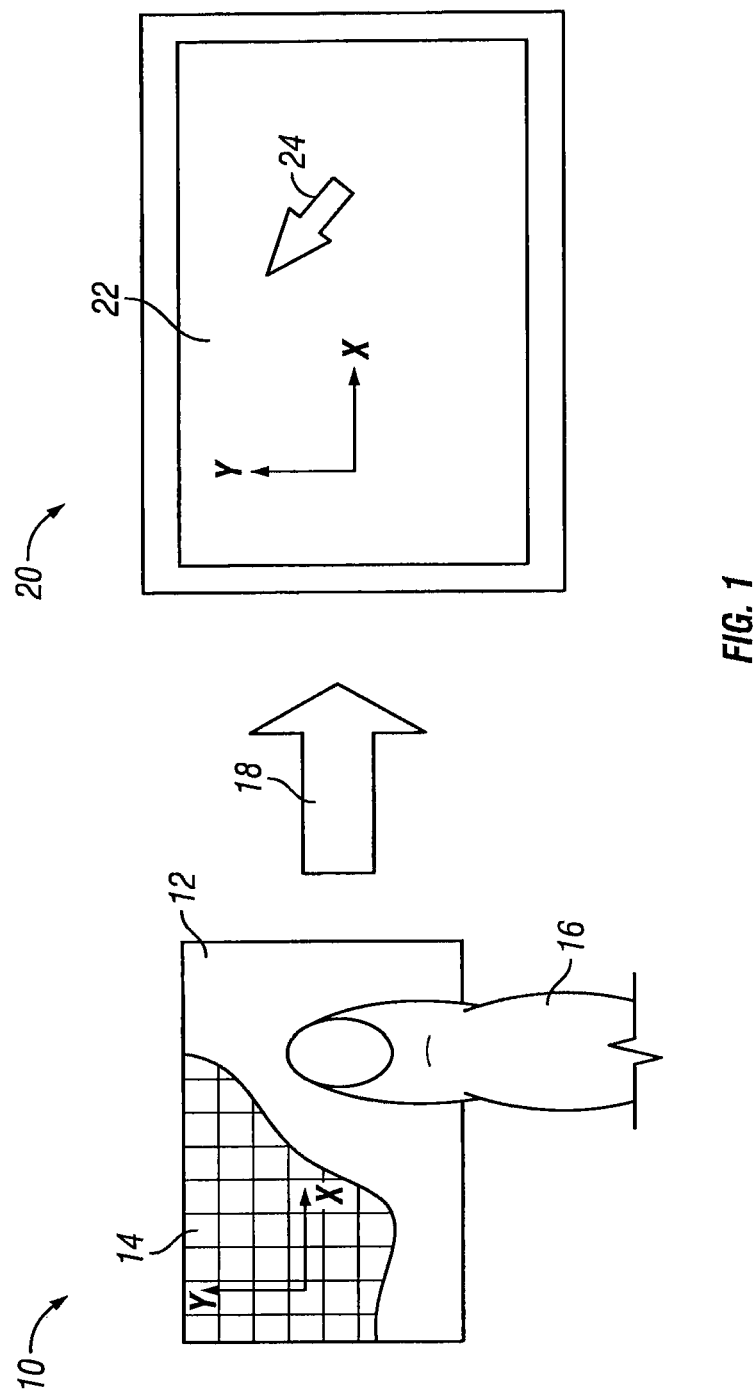
FIG. 1 is diagram of an input device including a touch sensor, according to one embodiment of the present disclosure.

In the following description of embodiments, reference is made to the accompanying drawings which form a part hereof, and in which it is shown by way of illustration specific embodiments that can be practiced. It is to be understood that other embodiments can be used and structural changes can be made without departing from the scope of the disclosed embodiments.

This relates to a touch sensor pattern with a secondary sensor formed substantially as part of the touch sensor pattern. By forming the secondary sensor substantially as part of the touch sensor pattern, where the secondary sensor can be grounded, or driven to a low-impedance state, during a touch scan cycle of the touch sensor, an overall thickness of the stackup at the area of the touch sensor where the secondary sensor is formed can be significantly reduced. The reduction in the thickness can allow more space for other hardware such as a device battery, for example. Moreover, grounding the secondary sensor can shield the touch sensor pattern at the area of the touch sensor pattern where the secondary sensor is formed, during a touch scan cycle. In addition, the touch sensor pattern can provide touch sensitivity over the entire surface area of a touch sensor device, including the portion where the secondary sensor is formed.

Touch surfaces, such as track pads for example, can use a Cartesian coordinate system to monitor the position of a pointer device (e.g., finger or stylus), for example, as it is moved. The Cartesian coordinate system is generally defined as a two dimensional coordinate system (x, y) in which the coordinates of a point (e.g., position of finger) can be determined from a grid or array of touch sensors or pixels formed at intersecting electrodes, for example. In some cases, the electrodes can be arranged in a grid of columns and rows; however, various electrode patterns can be used. Distinct x and y position signals, which control the x, y movement of a pointer device on the display screen, can thus be generated when the pointer device is moved across the grid of sensors within the touch surface. The following discussion is directed to capacitive sensing technologies; however, it is noted that the other technologies can be similarly implemented and the present disclosure is not limited to any particular sensing technology.

Mutual capacitance touch sensors, for example, can be formed from a matrix of drive and sense electrodes of a conductive material. Drive signals can be transmitted through the drive electrodes, resulting in signal (mutual) capacitances between the drive and sense electrodes at the crossover points (touch pixels) of the drive electrodes and the sense electrodes. The changes in signal capacitances due to a touch can be determined from sense signals that appear on the sense electrodes.

Capacitive sensing surfaces generally contain several layers of material. For example, the capacitive sensing surface can include a protective/cosmetic shield (usually a dielectric material), one or more electrode layers and a substrate. The protective shield can cover the electrode layer(s), and the electrode layer(s) can be formed on the substrate. The substrate may be, for example, glass, polyethylene-terephthalate (PET), or any plastic or flex substrate, or a printed circuit board (PCB). The protective shield is the part of the capacitive sensing surface that can be touched by the user to perform functions such as control operations, gestures, or cursor movements on a display screen, for example.

The capacitive sensing surface can also be coupled to, or include, sensing electronics for detecting signals associated with the sense electrodes. As is described in further details below with reference to the figures, the sensing electronics can be adapted to detect the change in capacitance at each of the sense electrodes as a finger or other object passes over or contacts the touch surface. As explained below, the sensing electronics can include an application specific integrated circuit (ASIC) that can be configured to detect a change in capacitance at each of the electrodes and to compute the position of finger movement based on the change in capacitance at each of the sense electrodes. The ASIC can also be configured to report this information to other logic within the computing device, such as a host processor.

Referring to FIG. 1, a touch-sensitive surface 10, according to an exemplary embodiment, will be described in greater detail. The touch-sensitive surface 10 may be a track pad, touch screen, touch mouse, or any other touch surface. A touch-sensitive surface is described herein as an exemplary touch sensor device including a secondary sensor.

The touch surface area can include a protective/cosmetic shield 12 and a plurality of touch pixels 14 that can, in some embodiments, be formed from the crossover points of drive and sense electrodes disposed underneath the protective shield 12. The drive and sense electrodes forming touch pixels 14 can be formed on a substrate such as glass, plastic, or a printed circuit board (PCB). Each of the touch pixels 14 can determine an x, y position. For example, AC stimuli can be applied to one or more drive electrodes (e.g., the one or more rows of electrodes), and each stimulation signal on a drive electrode can cause a charge to be injected into the sense electrodes (e.g., one or more columns of electrodes) through the mutual capacitance present an "intersection" of a drive electrode and sense electrode, where the drive electrode passes above or below the sense electrode without making direct electrical contact. A change in the injected charge can be detected when a finger or other object is present at one or more of the affected touch pixels. The capacitance between drive and sense electrodes can appear as a stray capacitance when the given drive electrode is held at DC voltage levels and as a mutual signal capacitance when the given drive electrode is stimulated with an AC signal. The presence of a finger or other object near or on the touch sensor panel can be detected by measuring changes to a signal charge present at pixels being touched.

The sensing electronics (not shown) can detect changes in capacitance and signal charge, and produces an x, y input signal 18 corresponding to the allocation of a finger or other object touching the touch surface. In some embodiments, this input signal 18 can be sent to a host device 20 (e.g., a computing device) having a display screen 22. The x, y input signal 18 can be used for a number of purposes, such as to control the movement of a cursor 24 on a display screen 22. As shown, the input pointer can move in a similar x, y direction as the detected x, y finger motion.

Figure 2A:
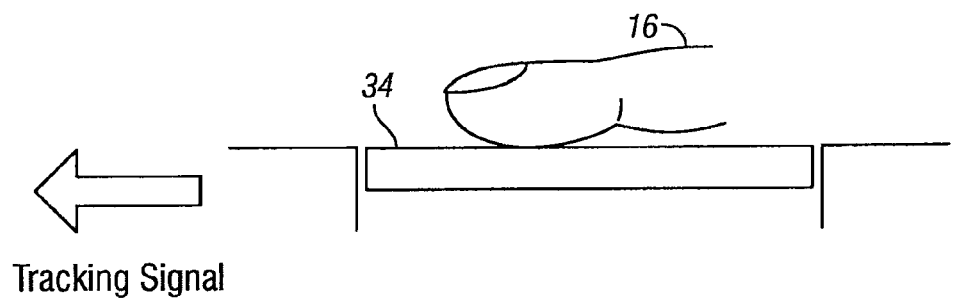
FIGS. 2A and 2B are simplified side views of an input device having a button touch pad, according to one embodiment of the present disclosure.
Figure 2B:
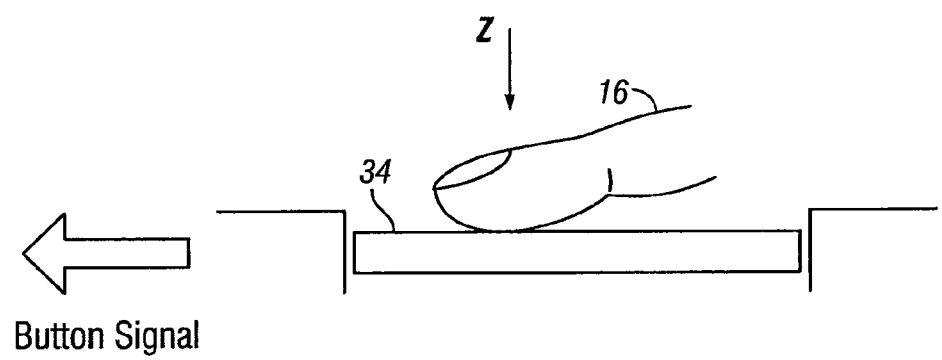

In some embodiments, such as the illustrated embodiment, the touch surface can be a track pad that also includes a button sensor to allow the track pad to act as a depressible button. The touch surface can include one or a plurality of button sensors, such that one or more additional button functions can be implemented by pressing on a designated portion of the touch surface rather than tapping on the touch surface or using a separate button/separate zone. It should be noted that the touch surface in this exemplary embodiment can include any alternative or additional types of secondary sensor(s) (touch or non-touch sensors), and a button sensor is described herein for exemplary purposes only. As shown in FIGS. 2A and 2B, according to one embodiment, touch surface 34 is capable of moving between an upright (or neutral) position (FIG. 2A) and a depressed (or activate) position (FIG. 2B) when a force from a finger 16, palm, hand, or other object is applied to the touch surface 34.

The button signals can be used for various functionalities including but not limited to making selections or issuing commands associated with operating an electronic device. By way of example, in the case of a music player, the button functions can be associated with opening a menu, playing a song, fast forwarding a song, seeking through a menu and the like. In the case of a laptop computer, the button functions can be associated with opening a menu, selecting text, selecting an icon, and the like.

Figure 3A:
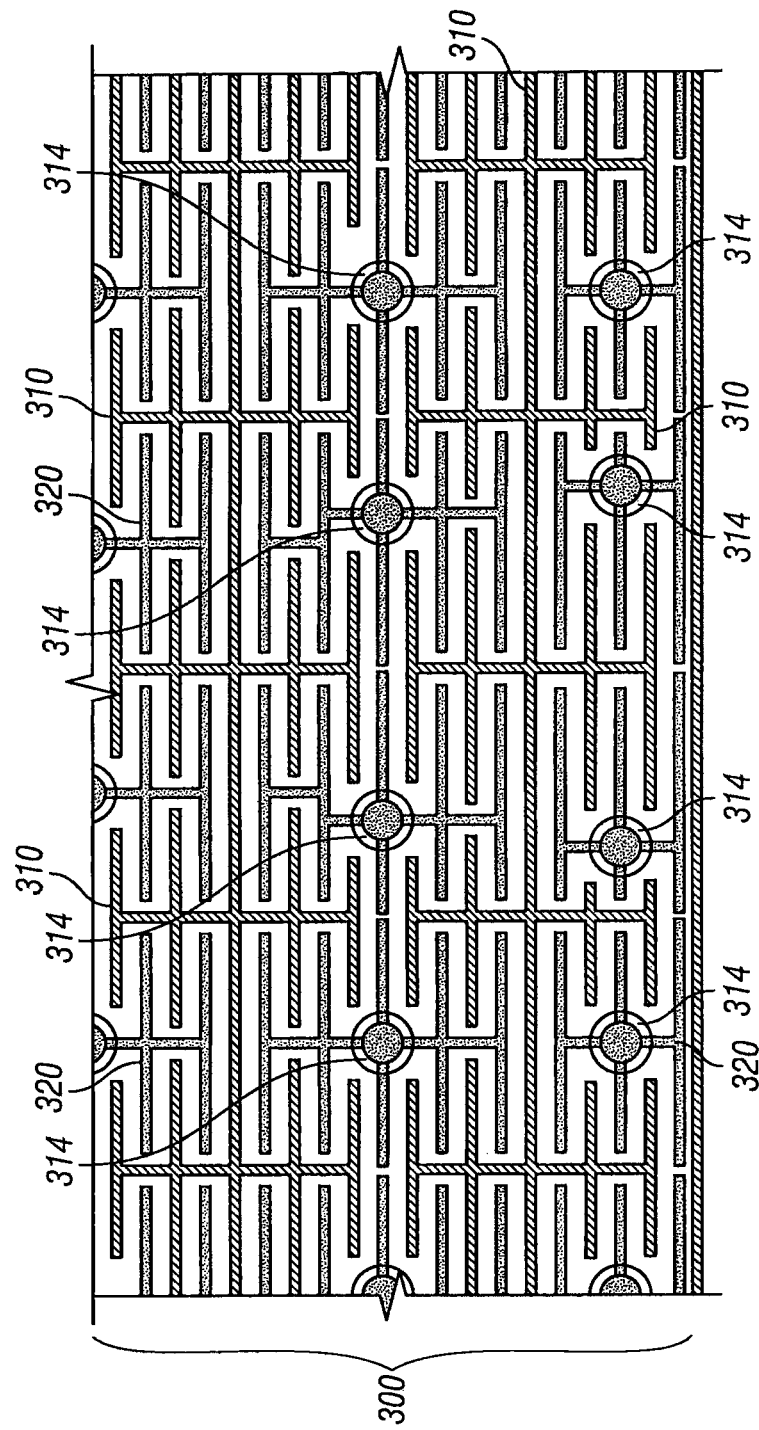
FIGS. 3A, 3B, 3C, 3D and 3E are exemplary circuit layouts for multiple layers of a touch sensor with a dome switch, according to one embodiment of the present disclosure.

FIG. 3A illustrates an exemplary touch sensor pattern 300, according to an embodiment disclosed herein. The exemplary touch sensor pattern 300 can have a plurality of row traces (e.g., drive electrodes 310) and a plurality of column traces (e.g., sense electrodes 320), where in the depicted exemplary touch sensor pattern 300, the sense electrodes 320 can be interconnected using any number of vias 314. The conductive traces can be formed of any conductive material (e.g., copper, silver ink, etc.), and can be printed or laminated (or otherwise formed) on PET or any other suitable substrate. One of ordinary skill in the art will understand that the drive electrodes 310 and sense electrodes 320 can be deposited or patterned on a substrate using a variety of techniques. In the case of a touch screen, for example, the row and column traces can be formed from a transparent conductive material such as Indium Tin Oxide (ITO) or Antimony Tin Oxide (ATO) to mitigate visual artifacts, although other transparent and non-transparent materials such as copper can also be used. In some embodiments, the row and column electrodes can be generally perpendicular to each other, although in other embodiments non-Cartesian orientations are possible. For example, in a polar coordinate system, the sense electrodes 320 can be concentric circles and the drive electrodes 310 can be radially extending electrodes (or vice versa). The conductive electrodes can be formed using various design patterns, including (but not limited to) an interdigitated comb design, interconnected diamond patterns, etc.

Figure 3B:
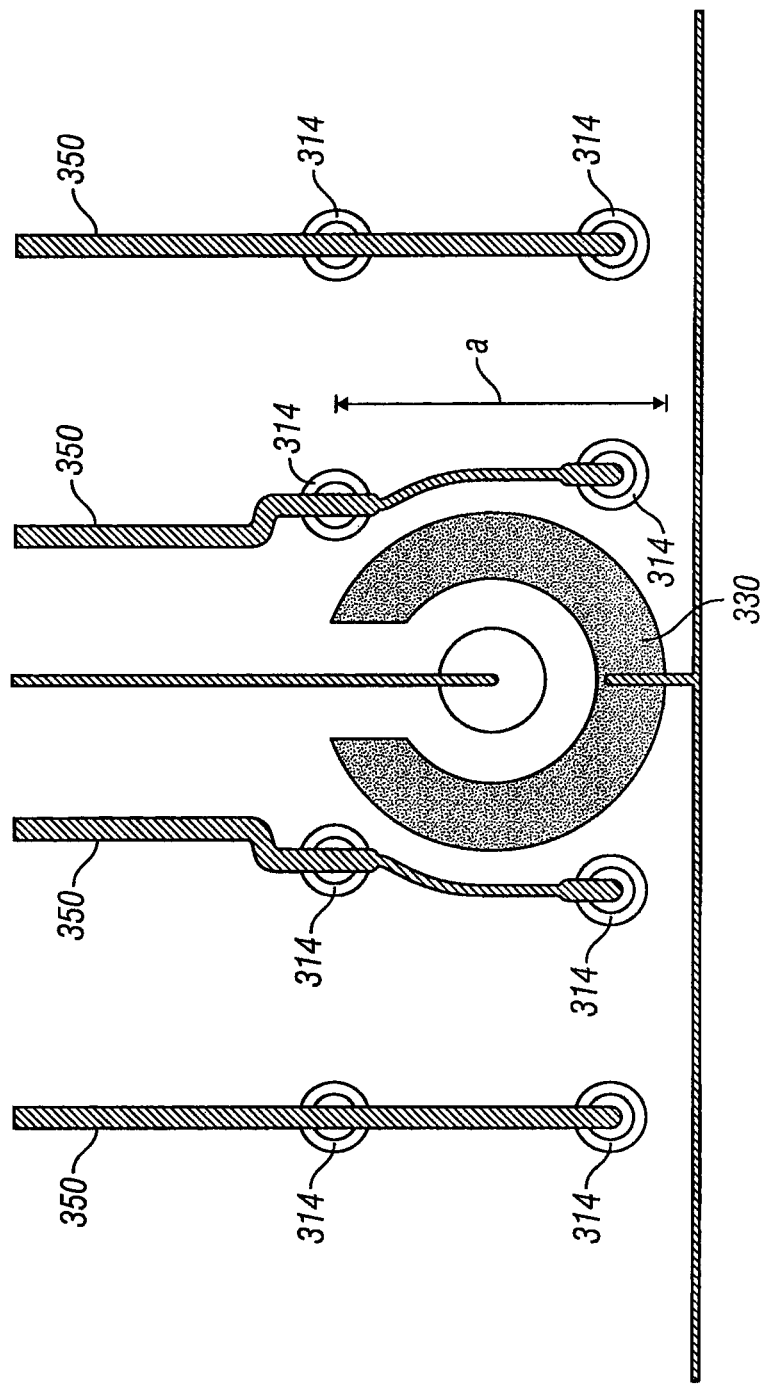

FIG. 3B shows a second layer of printed (or otherwise deposited) conductive material corresponding to jumpers 350 (which can allow the sense electrodes 320 to cross over the drive electrodes 310 on the second layer) and dome switch land pads (i.e., button pattern 330) according to some embodiments. In this exemplary touch sensor pattern 300, a dome switch circuit is formed substantially as part of or integrated with the touch sensor pattern 300; however, various other types of secondary sensors can be formed as part of the touch sensor pattern 300, without departing from the scope of the present disclosure. For example, self-capacitance sensors, proximity sensors, tact switches, pressure sensors, or any other sensor that can be physically and/or time multiplexed with the touch sensor can be formed as part of touch sensor pattern 300. Similarly, jumpers 350 and dome switch land pads 330 can be printed or otherwise deposited using silver ink, for example, on substrates such as glass, PET, polymide, polycarbinate or other plastic, PCB and the like.

Figure 3C:
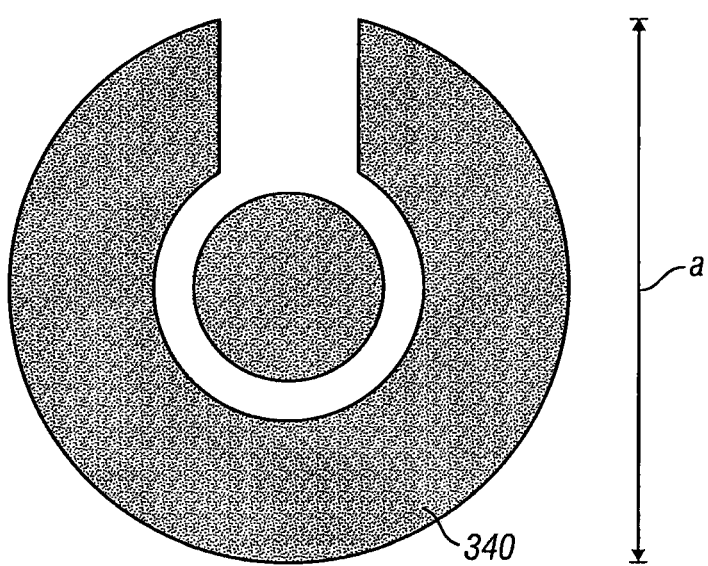

FIG. 3C shows yet another layer corresponding to a cover layer 340 that covers the dome land pads, according to some embodiments. The cover layer 340 can be any conductive material, such as carbon, for example. When the cover layer contacts the dome switch land pads (i.e., when the button is pushed (see FIG. 2B)), the dome switch land pads (i.e., button pattern 330) can contact the dome button 370 (see FIG. 3E), causing a button signal to be transmitted to a control unit (not shown) to indicate that a selection, for example, by a user at the point indicated by the touch surface has been made. It is noted that the control unit can include any number of devices or device combinations as known in the art. These include, for example, general purpose processors, content addressable memory modules, digital signal processors, application-specific integrated circuits, field programmable gate arrays, programmable logic arrays, discrete gate or transistor logic, or other such electronic components.

Figure 3D:
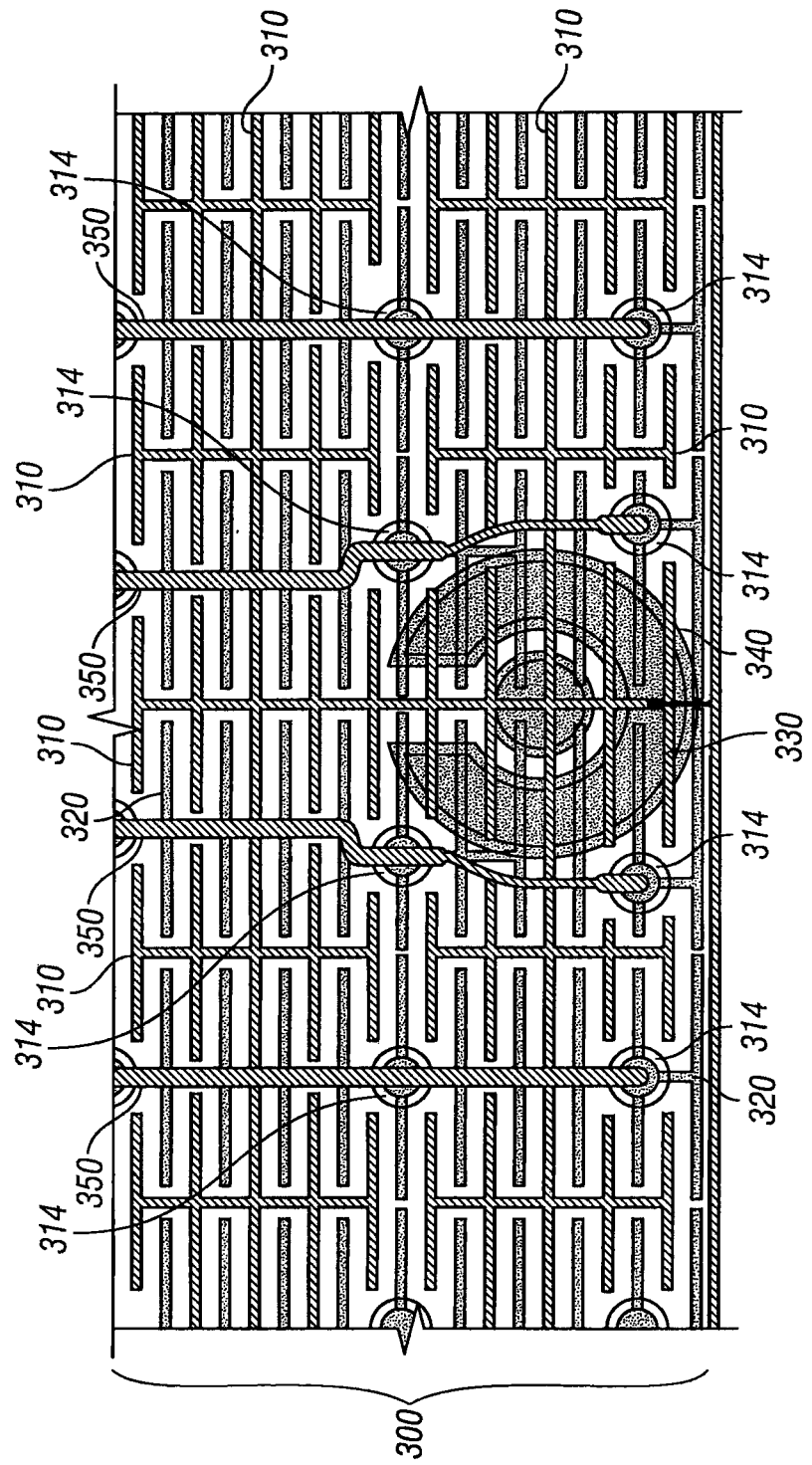

FIG. 3D shows all three printed layers described above with reference to FIGS. 3A, 3B and 3C, including the touch sensor pattern 300; the drive electrodes 310 and sense electrodes 320, dome switch land pads 330 and jumpers 350; and cover layer for the dome switch land pads, according to the illustrated embodiment.

Figure 3E:
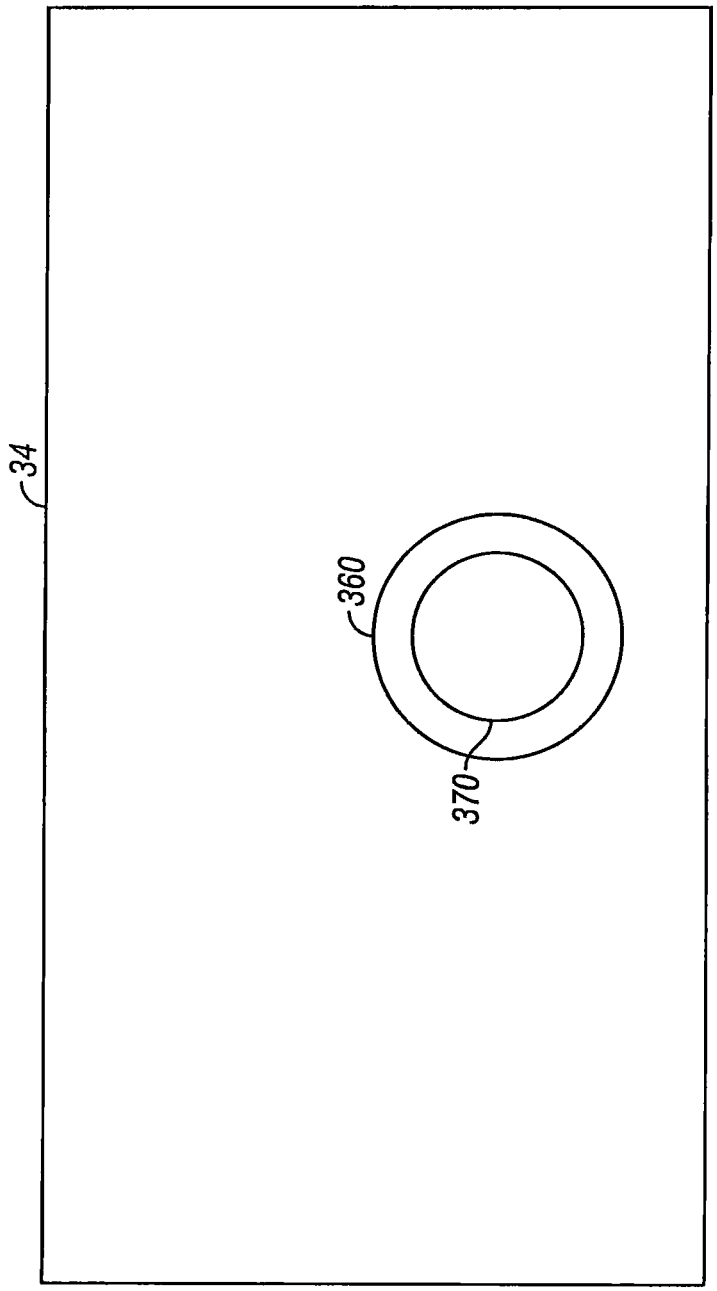

FIG. 3E shows the back of an exemplary touch surface 34 assembly housing touch sensor pattern 300 (FIG. 3A) and button pattern 330 (FIG. 3B). As noted above, a touch surface 34 assembly is described as a mere exemplary input device including a touch sensor pattern 300, and various other touch devices could be utilized without departing from the scope of the present disclosure. The back of the touch surface 34 can include a conductive shielding, or grounded material to prevent interference between any conductive components within the same device and below the touch surface 34, and the touch sensor pattern 300 and/or button pattern 330. The shield layer on the back of touch surface 34 can include a cutout portion 360 through which dome button 370 can be activated when a user depresses the button sensor. According to an embodiment, the back of touch surface 34 may not require shielding if the nearest conductor below the touch surface does not change significantly in relation to the touch surface 34 during operation and no interfering electrical signals are radiated from the electronics situated below the touch surface 34 (if any electronics or antennae are present).

One unique characteristic of the exemplary circuit layout of FIGS. 3A-3E is that the dome switch (button pattern) 330 can be formed substantially as part of the touch sensor pattern 300, and in some embodiments, formed as part of the same process used to form one of the layers of the touch sensor pattern 300. That is, with respect to the geometric area of the touch sensor pattern 300, the area of the button pattern 330 can be substantially enveloped therein. In order to allow both sensors to be operational while one is formed as part of the other, inputs to the touch sensor pattern 300 and the secondary sensor (button pattern 330, in this case) can be multiplexed through an interface such as a general purpose input/output (GPIO) interface (not shown). In such a manner, during a touch scan cycle of the touch sensor pattern 300, the button pattern 330 can be held at a steady state from the perspective of the touch sensor pattern 300. In order to hold the button pattern at a steady state, the button pattern 330 can be grounded, or virtually grounded by being held at a constant direct current (DC) voltage, with respect to the touch sensor pattern 300 (i.e., alternating current (AC) shielding the button sensor pattern 300). Alternatively, the button pattern 330 can be held at a steady state by AC coupling the button pattern 330 to at least one of a DC voltage or ground.

Figure 4:
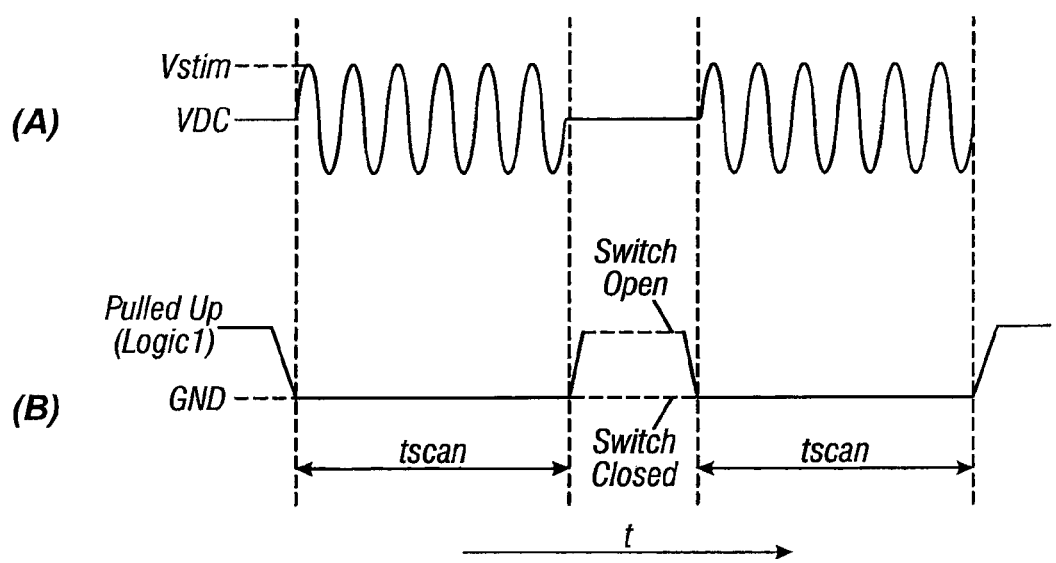
FIGS. 4A and 4B are exemplary timing diagrams of a touch sensor and a secondary sensor formed substantially as part of the touch sensor, according to one embodiment of the present disclosure.

When the button pattern 330 is grounded or held at a steady state with respect to the touch sensor pattern 300, touch sensor pattern 300 can perform a touch scan cycle even at a portion of the touch sensor pattern 300 where the button pattern 330 is formed. For example, in a case of a mutual capacitive touch sensor, AC stimuli Vstim (see FIG. 4), for example, can be applied to one or more drive electrodes 310, where Vstim can be at different frequencies and/or phases for each drive electrode 310. Each stimulation signal on a drive electrode 310 can cause a charge to be injected into the sense electrodes 320 through the mutual capacitance present at pixels (i.e., an "intersection" of the drive electrode 310 and sense electrode 320, where the drive electrode 310 passes above or below the sense electrode 320 without making direct electrical contact). A change in the injected charge can be detected when a finger or other object is present at one or more of the affected pixels. The capacitance between drive and sense electrodes can appear as a stray capacitance when the given drive electrode 310 is held at DC voltage levels and as a mutual signal capacitance when the given drive electrode 310 is stimulated with an AC signal. The presence of a finger or other object near or on the touch sensor panel can be detected by measuring changes to a signal charge present at one or more pixels being touched.

FIGS. 4A and 4B show exemplary timing diagrams of cycles of touch sensor pattern 300 and button pattern 330, respectively. As shown in FIGS. 4A and 4B, during a scan cycle ($t_{scan}$), when touch sensor pattern 300 is stimulated (i.e., Vstim is applied to drive electrodes 310) (FIG. 4A), button pattern 330 can be can be grounded (GND) (FIG. 4B). A sine wave with any number of cycles can be implemented during scan cycle $t_{scan}$, according to an embodiment. One of ordinary skill in the art would realize that $t_{scan}$ can be implemented as a square wave, sinusoidal wave, or any other periodic waveform. As noted above, button pattern 330 can be virtually grounded by being held at a constant DC voltage with respect to the touch sensor 300. Alternatively, button pattern 330 can be held at a steady state by AC coupling the button pattern 330 to at least one of a DC voltage or ground. When touch sensor pattern 300 is inactive (e.g., held at a constant DC voltage ($V_{DC}$)), button pattern 330 can be stimulated (i.e., pulled up to logic 1, if the switch is open), since its noise effect on touch sensor pattern 330 is irrelevant. Of course, it is not necessary for the button pattern to be pulled up to logic 1 when touch sensor pattern 300 is inactive. Various states of the button pattern (switch open or closed) are depicted with dotted lines, while touch sensor pattern 300 is inactive. If button pattern 330 were not grounded with respect to the touch sensor pattern 300 at time $t_{scan}$, capacitive interference or noise between the button pattern 330 and touch sensor pattern 300 could cause the touch sensor pattern 300 to malfunction at the area of the touch sensor pattern 300 at which button pattern 330 is formed. Touch sensing at this area could be unreliable or impossible in this case.

Further, at the back of touch surface 34 assembly where cutout portion 360 of the ground shield is located, touch sensor pattern 300 can be susceptible to noise interference cause by electrical components located below track pad assembly 34. That is, a change in signal charge at one or more pixels, located proximate the cutout portion 360 of the ground shield, when a given drive electrode 310 is stimulated with an AC signal (which can indicate the presence of a finger or other object near or on the touch surface) may be immeasurable or inaccurately measured due to noise. However, holding the button pattern 330 at a steady state during a touch scan cycle can effectively shield the portion of the touch sensor pattern 300 that is exposed due to cutout portion 360 of the ground shield. Therefore, because the portion of the touch sensor pattern 300 can be shielded by holding button pattern 330 at a steady state during a touch scan cycle, the button pattern 330 can be formed substantially as part of the touch sensor pattern 300 without the need for additional shield layers or substrate layers, and without diminishing the touch sensitivity over any part of the entire area of the touch sensor pattern 300.

On the other hand, if the button pattern 330 is not grounded, then it may be necessary to print or laminate the button pattern 330 to a portion of the flexible substrate such as PET, for example, that protrudes out from the touch sensor pattern 300 (i.e., a non-integrated portion of the substrate, with respect to the area of the touch sensor pattern 300). In that case, a ground shield layer can be placed over the entire touch sensor pattern 300, and the protruding portion of the PET (with the button pattern printed or laminated thereon) can be folded over the ground shield layer, such that the button pattern 330 and the touch sensor pattern 300 can be shielded from each other and the touch sensor pattern 300 can be shielded from all other electrical components over its entire area. However, such a non-integrated design can essentially double, if not more than double, the thickness of the "critical stackup" of materials at the area of the touch sensor pattern 300 that is overlapped by the button pattern 330. In this case, the "critical stackup" refers to layers of materials used at the area of the touch sensor pattern 300 where the button pattern 330 is located.

Figure 5A:
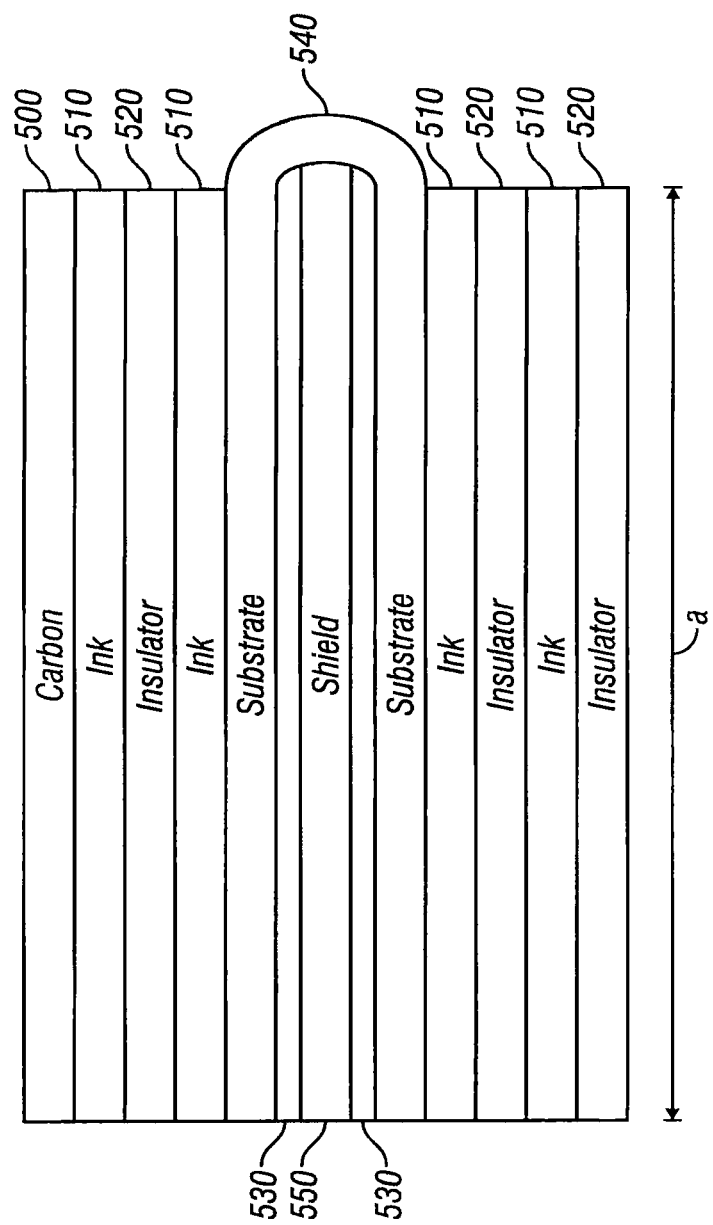
FIGS. 5A and 5B are exemplary touch sensor stackups, according to embodiments of the present disclosure.

FIG. 5A illustrates an exemplary stackup (a cross section along length "a" (see, e.g., FIGS. 3B and 3C)) at the area of the touch sensor pattern 300 overlapped by the area of the button pattern 330, according to an example where the button pattern is folded over the shield layer (i.e., a non-integrated design). The exemplary critical stackup at the cross section along length "a," from the top down, can include: a carbon cover layer 500 (~15 μm); an ink layer 510 (e.g., silver ink) for the dome switch land pads (~10 μm); an insulating shield layer 420 (~40 μm); another ink layer 510 (~10 μm), which can be a routing layer for a secondary sensor signal, for example, that can connect a center signal contact; a substrate layer 540 (e.g., PET) (~25 μm); an adhesive layer 530 (e.g., PSA) (~60 μm); a shield layer 550 (~75 μm); another adhesive layer 530 (~60 μm); another substrate layer 540 (~25 μm); an ink layer 510 for the touch sensor pattern (~10 μm); another insulator layer 520 (~40 μm); a final ink layer 510 of jumpers and drive and sense electrodes 310, 320 (~10 μm); and a final insulator layer 529 (~40 μm). The total thickness of the exemplary stackup of FIG. 5B measures ~395 μm. Exemplary estimated thicknesses of each layer are provided for illustrative purposes only. One of ordinary skill in the art would realize that the layers described above may have varying thicknesses.

Figure 5B:
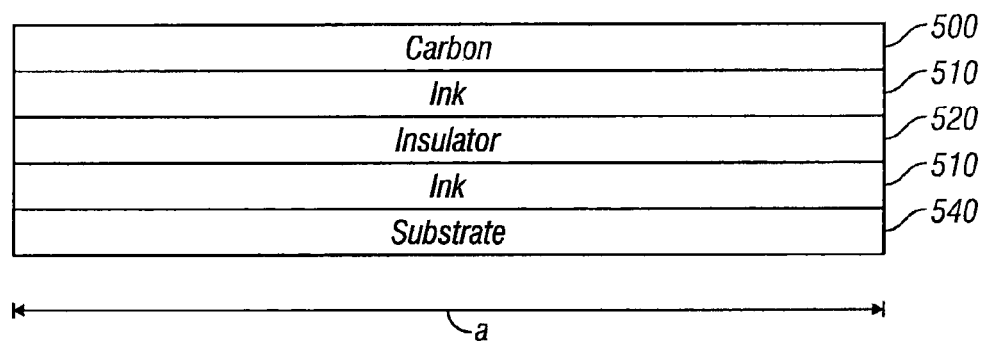

FIG. 5B illustrates an exemplary stackup (a cross section along length "a" (see, e.g., FIG. 3D)) at the area of the touch sensor pattern 300 where the button pattern 330 is formed as a part thereof, in accordance with an embodiment of the present disclosure. The exemplary stackup, from the top down, can include: a carbon cover layer 500 (~15-30 μm); an ink layer 510 (e.g., silver ink) for the dome switch land pads, jumpers and drive and sense electrodes 310, 320 (~10 μm); an insulating layer 520 (~40 μm); an ink layer 510 for the touch sensor pattern 300 (~10 μm); and a substrate layer 540 (e.g., PET) (~25 μm). The total stackup in the exemplary embodiment of FIG. 5B measures ~125 μm. A shield layer 550 can be used to cover the portion of the touch sensor that does not include the button pattern. However, a shield layer 550 may not be necessary between the button pattern 330 and the touch sensor pattern 300 in this embodiment, since the button pattern 330 can be formed substantially as part of the touch sensor pattern 300. That is, the "critical stackup" at the area of the touch sensor 300 where the button pattern 330 is formed may not require a shield layer 550.

Accordingly, since the PET 540 including the button pattern does not have to be folded back over a shield layer 550 separating the button pattern 330 from the touch sensor pattern 300, a significant reduction in the overall thickness of the stackup at the area of the touch sensor where the button pattern is formed can be obtained. In fact, as compared with the stackup depicted in FIG. 5B, the thickness of the exemplary stackup of FIG. 5A is more than double. The reduction in the thickness of the stackup in FIG. 5B can allow more space for other hardware such as a device battery, for example. Moreover, grounding the button pattern 330 can shield the touch sensor 300, at the area of the touch sensor 300 where the button pattern 330 is formed, during a touch scan cycle from any undesired noise interference caused by contact with or proximity to a conductive object. In addition, touch sensor pattern 300 can provide touch sensitivity over the entire area of the touch sensor device, including the portion at which the button pattern 330 is formed.

Figure 6A:
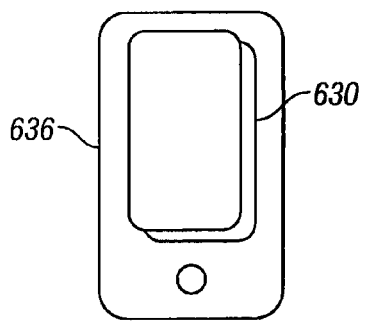
FIG. 6A illustrates an exemplary mobile telephone that can include a touch sensor according to one embodiment of the disclosure.

FIG. 6a illustrates exemplary mobile telephone 636 including a touch screen device 630, the touch screen device 630 including a touch sensor with a secondary sensor, according to one disclosed embodiment. As provided above, in the case of a touch screen device 630 including a touch sensor with a secondary sensor, the drive and sense electrodes and/or the secondary sensor pattern can be formed on a glass or other transparent substrate, and formed of a transparent conductive material such as ITO or ATO, to mitigate visual artifacts, although other transparent and non-transparent materials such as copper can also be used.

Figure 6B:
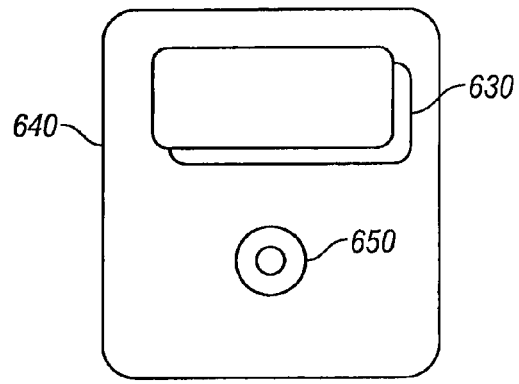
FIG. 6B illustrates an exemplary digital media player that can include a touch sensor according to one embodiment of the disclosure.

FIG. 6b illustrates exemplary digital media player 640 that can include a touch screen device 630 and a track pad device 650. The touch screen device 630 and/or the track pad device 650 can include a touch sensor with a secondary sensor, according to one disclosed embodiment.

Figure 6C:
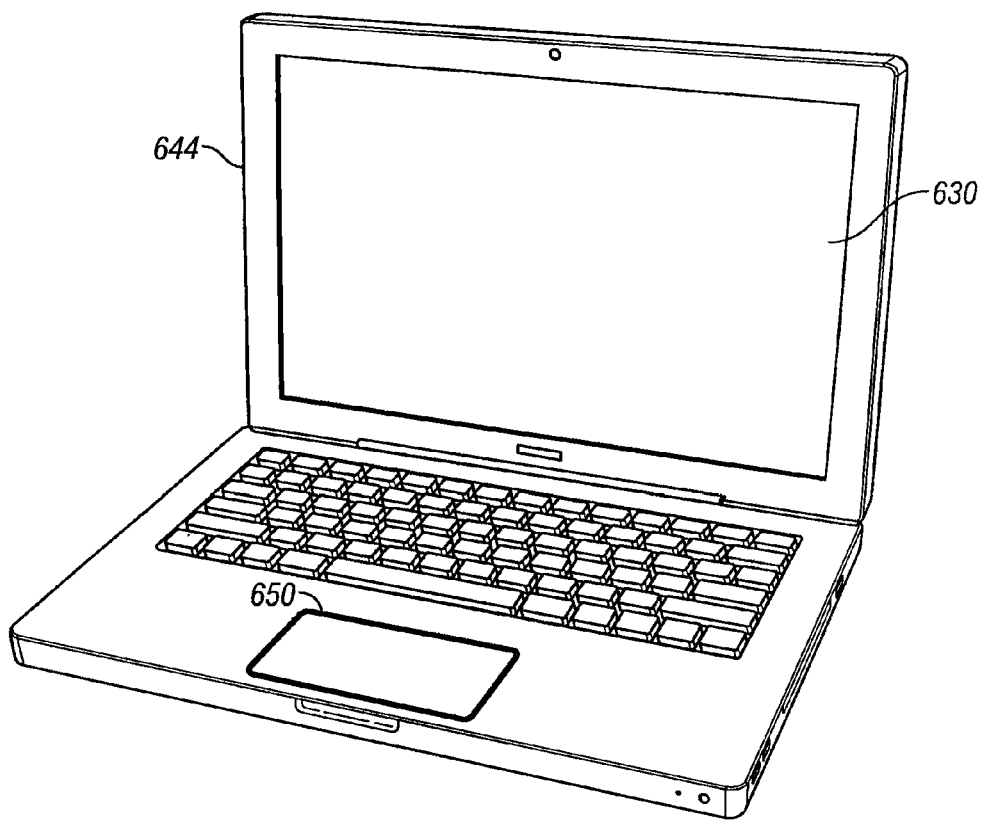
FIG. 6C illustrates exemplary personal computer that can include a touch sensor according to one embodiment of the disclosure.

FIG. 6c illustrates exemplary personal computer 644 that can include a display 630, and a track pad 650 including a touch sensor with a secondary sensor, according to one disclosed embodiment. Track pad 650 can be generally configured to send information or data to an electronic device (not shown) in order to perform an action on display 630 (e.g., via a graphical user interface (GUI), such as moving an input pointer, making a selection, providing instructions, etc. The input device can interact with the electronic device through a wired (e.g., cable/connector) or wireless connection (e.g., IR, bluetooth, etc.).

Track pad 650 can be a stand alone unit or it may be integrated into the electronic device, as shown in FIG. 6c. In some cases, the input device can be removably coupled to the electronic device as for example through a docking station. By way of example, the personal computer 644 can correspond to a computer such as a desktop computer, laptop computer or PDA.

Note that one or more of the functions described above can be performed, for example, by firmware stored in memory (e.g., a peripheral) and executed by processor subsystem (not shown), or stored in program storage (not shown) and executed by host processor (not shown). The firmware can also be stored and/or transported within any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

What is claimed is:

1. A touch surface, comprising:
   a touch sensor pattern including at least one touch sensor; and
   at least one secondary sensor formed substantially as part of the touch sensor pattern,
   wherein the at least one secondary sensor is configured to be grounded or held at a low-impedance state during a touch scan cycle, and
   the at least one secondary sensor is configured to shield at least a portion of the touch sensor pattern during the touch scan cycle; wherein the at least one secondary sensor is a button sensor.

2. The touch surface of claim 1, further comprising a shielding material formed on a back side of the touch surface, the shielding material having a cutout portion for the secondary sensor.

3. The touch surface of claim 1, further comprising an interface coupled to the touch sensor pattern and the secondary sensor, the interface configured for multiplexing inputs to the touch sensor pattern and the secondary sensor.

4. The touch surface of claim 1, wherein the at least one secondary sensor is configured to be grounded or held at a low-impedance state by alternating current (AC) shielding the at least one secondary sensor from the touch sensor pattern.

5. The touch surface of claim 1, wherein the at least one secondary sensor is configured to be grounded or held at a low-impedance state by coupling the at least one secondary sensor to ground.

6. The touch surface of claim 1, wherein the at least one secondary sensor is configured to be grounded or held at a low-impedance state by AC coupling the at least one secondary sensor to at least one of a direct current (DC) voltage or ground, for frequencies in-band with respect to operation of the touch sensor pattern.

7. The touch surface of claim 1, wherein the at least one secondary sensor is a proximity sensor.

8. The touch surface of claim 1, wherein at least one of the touch sensor and the at least one secondary sensor is formed on a flexible substrate including at least one of polyethyleneterephthalate (PET), polymide, and polycarbinate.

9. The touch surface of claim 1, wherein at least one of the touch sensor and the at least one secondary sensor is formed on a glass substrate.

10. The touch surface of claim 1, wherein the touch sensor is incorporated within a touch sensor panel, which is part of a computing system.

11. The touch surface of claim 10, wherein the touch sensor is incorporated within an input device of the computing system.

12. The touch surface of claim 10, wherein the touch sensor is incorporated within a touch screen display of the computing system.

13. A method of forming a touch surface, comprising:
forming a touch sensor pattern;
forming at least one secondary sensor substantially as part of the touch sensor pattern; and
grounding or holding the at least one secondary sensor at a low-impedance state to shield at least a portion of the touch sensor pattern during a touch scan cycle; wherein the at least one secondary sensor is a button sensor.

14. The method of claim 13, wherein grounding or holding the at least one secondary sensor at a low-impedance state comprises alternating current (AC) shielding the at least one secondary sensor from the touch sensor.

15. The method of claim 13, wherein grounding or holding the at least one secondary sensor at a low-impedance state comprises coupling the at least one secondary sensor to ground.

16. The method of claim 13, wherein grounding or holding the at least one secondary sensor at a low-impedance state comprises AC coupling the at least one secondary sensor to at least one of a direct current (DC) voltage or ground.

17. The method of claim 13, wherein the at least one secondary sensor includes a proximity sensor.

18. The method of claim 13, wherein at least one of the touch sensor and the at least one secondary sensor is formed on a substrate including at least one of polyethylene-terephthalate (PET), polymide, and polycarbinate.

19. The method of claim 13, wherein at least one of the touch sensor and at least one secondary sensor is formed on a glass substrate.

20. The method of claim 13, wherein the touch sensor surface is incorporated within an input device.

21. The method of claim 20, wherein the input device is incorporated within a computing system.

22. The method of claim 20, wherein the touch sensor surface is incorporated within a touch screen display.

23. A system, comprising:
a touch sensor surface,
wherein the touch sensor surface includes
a touch sensor pattern, and
at least one secondary sensor formed as part of the touch sensor pattern and configured to be grounded or held at a low-impedance state, in order to shield at least a portion of the touch sensor pattern during a touch scan cycle of the touch sensor circuit; wherein the at least one secondary sensor is a button sensor.

* * * * *